United States Patent [19]
Gaylord et al.

[11] Patent Number: 5,765,890
[45] Date of Patent: Jun. 16, 1998

[54] DEVICE FOR TRANSFERRING A SEMICONDUCTOR WAFER

[75] Inventors: Eric Lee Gaylord, Matthews, N.C.; James Stuart Taylor, St. Peters, Mo.

[73] Assignee: MEMC Electronic Materials, Inc., St. Peters, Mo.

[21] Appl. No.: 724,908

[22] Filed: Oct. 3, 1996

[51] Int. Cl.$^6$ ............................................. B25J 15/06
[52] U.S. Cl. ............................ 294/65; 294/64.1; 414/941
[58] Field of Search ........................... 294/2, 16, 27.1, 294/34, 64.1–65; 414/939, 941; 901/40; 29/743, 758

[56] References Cited

U.S. PATENT DOCUMENTS

| | | | |
|---|---|---|---|
| 3,523,706 | 8/1970 | Logue | 294/64.3 |
| 4,557,514 | 12/1985 | Cushman et al. | 294/64.1 |
| 4,773,687 | 9/1988 | Bush et al. | 294/64.1 |
| 4,787,662 | 11/1988 | Dewez | 294/64.1 |
| 4,944,650 | 7/1990 | Matsumoto | 414/941 |
| 4,969,676 | 11/1990 | LaMagna | 294/64.3 |
| 5,022,695 | 6/1991 | Ayers | 414/941 |
| 5,050,919 | 9/1991 | Yakou | 294/64.1 |
| 5,093,550 | 3/1992 | Gerber et al. | 219/121.6 |
| 5,110,167 | 5/1992 | Friend | 294/16 |
| 5,127,692 | 7/1992 | Yakou et al. | 294/64.1 |
| 5,169,196 | 12/1992 | Safabakhsh | 296/64.3 |
| 5,226,758 | 7/1993 | Tanaka et al. | 406/86 |
| 5,268,067 | 12/1993 | Dostalik et al. | 156/643 |
| 5,281,297 | 1/1994 | Lee | 156/552 |
| 5,350,427 | 9/1994 | Freytsis et al. | 29/25 |
| 5,423,716 | 6/1995 | Strasbaugh | 451/388 |
| 5,439,523 | 8/1995 | Yamaguchi | 118/503 |
| 5,484,252 | 1/1996 | Mutoh | 414/941 |

OTHER PUBLICATIONS

"Vacuum Wands–Heavy Substrate Handling," H–Square Company, pp. 1–15, 1991, admitted prior art.

Primary Examiner—Dean Kramer
Attorney, Agent, or Firm—Senniger, Powers, Leavitt & Roedel

[57] ABSTRACT

A device for use in handling a semiconductor wafer from a front face of the wafer on which a finished surface is formed by processing of the semiconductor wafer, the front face including an outer peripheral edge margin. The device includes fingers having tip portions adapted to engage the wafer for use in holding the wafer and a frame mounting the fingers and positively locating the fingers for simultaneously engaging the wafer only on the outer peripheral edge margin of the wafer. The device further includes vacuum pressure passages terminating at the tip portions of the fingers for applying a vacuum pressure through the finger tip portions to the wafer to grip the wafer. The fingers are arranged for holding the wafer in a single predetermined orientation.

18 Claims, 1 Drawing Sheet

DEVICE FOR TRANSFERRING A SEMICONDUCTOR WAFER

BACKGROUND OF THE INVENTION

This invention relates generally to devices for handling semiconductor wafers without contaminating or damaging the wafers, and more particularly to a device for transporting semiconductor wafers to and from a susceptor.

The production of high quality semiconductor wafers requires the maintenance of damage free wafer surfaces. Handling of the wafers gives rise to the opportunity for damage or contamination. For example, damage or contamination frequently occurs during transfer of a wafer to a susceptor which is used for the deposition of an epitaxial layer on a front face of the wafer. The susceptor is a generally polygonal, vertically oriented tube made of silicon carbide coated graphite. Outer surfaces of the walls of the tube have circular recesses in them, each recess being sized to hold one wafer with the front face of the wafer directed outwardly from the susceptor. The susceptor holds multiple wafers in a reaction chamber during the epitaxial layer deposition process. Rear faces of the wafers generally engage the back of the recesses so that a minimum amount of material is deposited on the rear face.

Typically, wafers are transferred from a storage cassette to the susceptor recess by special tweezers (tongs) or a vacuum wand. The tongs engage the wafer on both the front and rear faces along peripheral edge margins of the front and rear faces. A vacuum wand engages a central portion of the rear face of the wafer. The wand cannot engage the front face of the wafer inwardly of its peripheral edge margin or contamination may occur. Engagement with the peripheral edge margin of the front face does not allow the wand to grip the wafer securely enough to pick it up.

The use of tongs or a vacuum wand requires the operator to insert the wafer into the wafer recess in a non-parallel fashion relative to the susceptor to provide a space between the back wall of the recess and the tong or wand engaging the rear face of the wafer. In either case, the wafer contacts the susceptor first at the bottom of the recess with the top of the wafer angling upwardly away from the recess. The top of the wafer is then frequently pushed into the recess with a separate pointed tool or tongs to seat the wafer in the recess. This often results in damage to the wafer by the tool or tongs. This loading and subsequent seating process also increases the chance of scraping the wafer against the sides of the recess during the manipulation of the wafer into the recess, resulting in damage to the wafer. Particulate contamination of the reactor and the wafer itself may result from even a small amount of scraping. These techniques occasionally result in the wafer not being securely placed against the susceptor resulting in thermally induced slip or the wafer falling off of the susceptor during processing.

The use of tongs or a vacuum wand also made it difficult to orient the wafer in a consistent manner in the susceptor recess, resulting in deposited silicon from previous reactor runs being underneath the wafer thereby preventing contact of the rear face of the wafer with the back wall of the recess. Moreover, the tongs used to carry the wafers rely solely on a frictional engagement with the faces of the wafer to grip the wafer. Thus, there are significant occurrences of wafers slipping out of the tongs and being damaged. The use of tongs or vacuum wand also requires the operator to have a high degree of manual dexterity to place the wafer in the susceptor recess without dropping the wafer or scraping it against the sides of the recess.

SUMMARY OF THE INVENTION

Among the several objects of this invention may be noted the provision of a device which provides for transfer of a semiconductor wafer to and from a susceptor without damage to the wafer; the provision of such a device which holds the wafer securely; the provision of such a device which can perpendicularly place the wafer in the susceptor while engaging only one face of the wafer; the provision of such a device which provides for consistent orientation of the semiconductor wafers on the susceptor; the provision of such a device which holds onto the wafer in such a way as to minimize the opportunity for contamination of the wafer by engagement with the device; and the provision of such a device which is easy to use.

A device of this invention is for use in handling a semiconductor wafer from a front face of the wafer on which a finished surface is formed by processing of the semiconductor wafer. The front face includes an outer peripheral edge margin. Generally, the device comprises fingers having tip portions adapted to engage the wafer for use in holding the wafer, and a frame mounting the fingers and positively locating the fingers for simultaneously engaging the wafer on the outer peripheral edge margin of the front face of the wafer while being free of engagement with a rear face of the wafer. Vacuum pressure passaging means terminates at the tip portions of the fingers for applying a vacuum pressure through the finger tip portions to the wafer to grip the wafer.

Other objects and features of the present invention will be in part apparent and in part pointed out hereinafter.

BRIEF DESCRIPTION OF THE DRAWINGS

Corresponding reference characters indicate corresponding parts throughout the several views of the drawings.

DESCRIPTION OF THE PREFERRED EMBODIMENT

Figure 1:
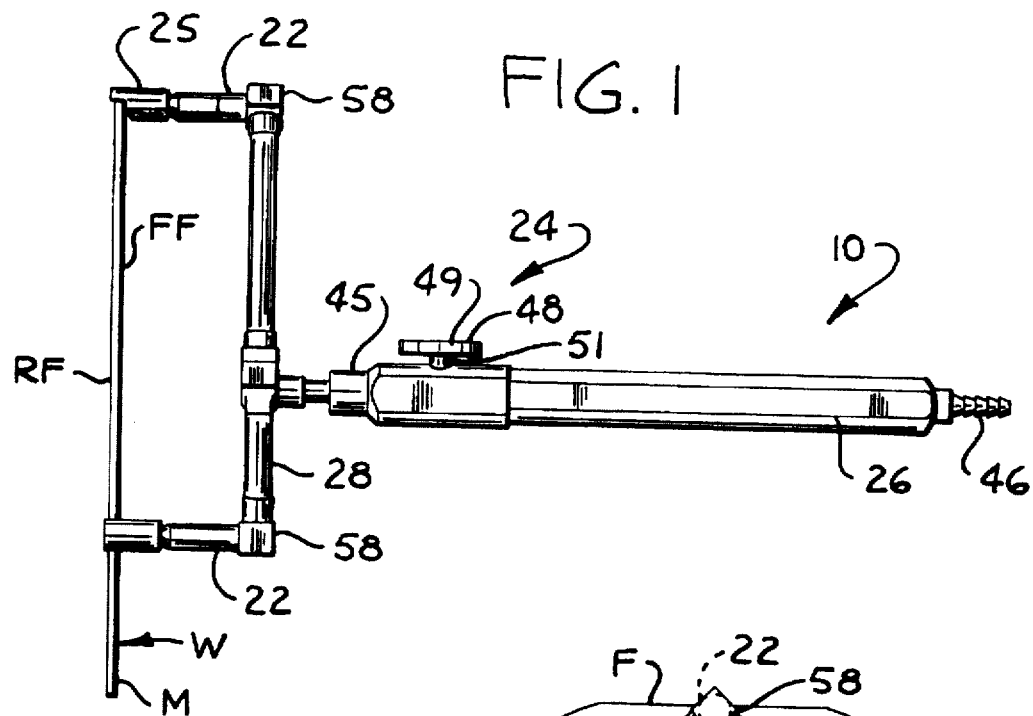
FIG. 1 is a side elevation of a device for use in handling a semiconductor wafer shown holding a semiconductor wafer.

Referring now to the drawings, and first to FIG. 1, a device for use in handling a semiconductor wafer W of the present invention is generally indicated at 10. The semiconductor wafer generally indicated at W includes a front face FF on which a finished surface is to be formed by processing of the semiconductor wafer, and a rear face RF which may or may not be finished. The front face FF of the wafer includes an outer peripheral edge margin M which is not used in the finished wafer. The edge margin is approximately 3 mm wide on a wafer having a diameter of 150 mm, for example. Thus, the outer peripheral edge margin M does not have to remain defect free during the handling of the wafer W. The wafer W is generally circular in shape and has a flat F formed therein along a portion of the outer peripheral edge margin.

The device 10 is operable to perpendicularly place the wafer W into a wafer recess in a susceptor (not shown) for processing in an epitaxial reaction chamber (not shown) in a suitable manner such as described in coassigned U.S. Pat. No. 5,518,549, the disclosure of which is incorporated herein by reference. It is to be understood that although the present invention has particular application to the handling of semiconductor wafers W in the context of epitaxial layer deposition, it may be used for handling other items in other applications and still fall within the scope of the present invention. The wafer recess is generally circular and lies in an upright wall of the susceptor in which the wafer W is supported on a thin lip of the recess. More particularly, the wafer W engages the lip generally along the edge of the wafer. As disposed in the wafer recess, the front face FF of the wafer W is directed outwardly of the recess. An epitaxial layer is formed on the front face FF by the deposition of semiconductor material from a chemical vapor which is circulated through the reaction chamber and over the susceptor.

The device 10 includes fingers 22, a frame (indicated generally at 24) mounting the fingers and vacuum pressure passaging means (generally indicated at 23) for applying a vacuum pressure through tip portions 25 of the fingers to the wafer W to grip the wafer. The frame 24 includes a handle 26 extending perpendicularly from the front face FF of the semiconductor wafer W held by the device 10, and a manifold portion 28 defining a frame passageway therein. The frame passageway is in fluid communication with a finger passageway 30 of each finger 22. The handle 26 and frame passageway provide a fluid passageway for the vacuum pressure to be transmitted to the fingers 22 mounted on the manifold portion 28. The manifold portion 28 is made up of a plurality of tubular members. Six tubular members 32 form a structure in the shape of a pentagon (see FIG. 2) lying in a plane generally parallel to the front face FF of the semiconductor wafer W held by the device 10.

Figure 2:
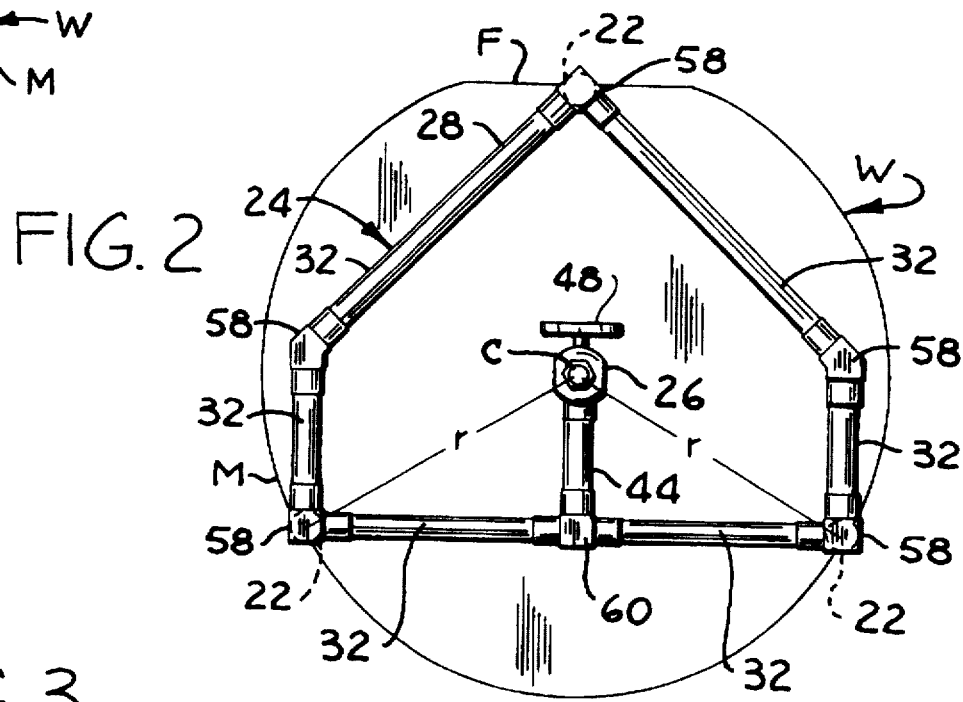
FIG. 2 is a front elevation of the device of FIG. 1 holding a semiconductor wafer.

As shown in FIG. 2 the frame 24 has a center C generally coaxial with the center of the semiconductor wafer W when the wafer is held by the device. The fingers 22 are constructed and arranged for gripping the wafer W only at its peripheral outer edge margin M, thereby eliminating contact of the fingers with the portion of the wafer which will be used after processing. The manifold portion 28 is arranged such that the two fingers 22 extending from lower corners of the pentagon (as seen in FIG. 2) are located a distance r from the center C of the frame and the third finger extending from the uppermost corner of the pentagon is located a distance less than r from the center C. Generally, the distance r corresponds to (but is slightly larger than) the radius of the wafer W. The distance of the third finger 22 from the center C of the frame 24 corresponds to the shortest distance between the center of the wafer and the flat F. This arrangement permits the wafer W to be securely held by the device 10 in only one position with the third finger 22 engaging the flat portion F of the outer peripheral edge margin M. This allows the wafer W to be placed in the susceptor with the wafer flat F oriented in the susceptor pocket the same way (e.g., at the top of the recess) as preceding and subsequent wafers. The frame 24 is configured such that the fingers 22 extending from the corners of the frame are spaced apart for engaging only the outer peripheral edge margin M of the front face FF of the wafer W. Different size devices are required for different diameter wafers. It is to be understood that various other frame shapes may be used and a different number of fingers may be connected to the frame without departing from the scope of this invention.

The frame 24 includes a seventh tubular member 44 connected to the manifold portion 28 and lying in the same plane as the manifold portion. The seventh tubular member 44 extends from the bottom of the manifold portion 28 to generally the center C of the frame. The handle 26 is connected to the seventh tubular member 44 and extends perpendicularly from the manifold portion 28. In the illustrated embodiment, the handle 26 is taken from a vacuum wand such as one available from H-Square Company, of Sunnyvale, Calif., under model designation number NOP191 or NCP191. For example, the dimensions of the handle shown in FIG. 1 are 0.62" in diameter and 6.2" in length. The handle 26 includes a tip 45 attached to the frame 24 and a barbed connector 46 capable of attachment to a source of vacuum pressure (not shown). The handle 26 may be formed from a polymeric material or other suitable material. The handle 26 further includes a valve 48 for selectively opening and closing the passageway in the handle to control the application of vacuum pressure through the finger tip portions 25. Thus, the pressure may be controlled at the device 10 instead of at a remotely located vacuum pressure source. The valve includes a button 49 and a stem 51 for positioning a gate or ball type valve, or other suitable type of shut off device within the handle.

The tubular members 32 are formed from 0.25" stainless steel tubing. The tubular members 32 are connected with stainless steel elbows 58 and a tee 60. Other suitable material, such as plastic, may be used and different tubing sizes may also be used. It is envisioned that a frame (not shown) could also be made from solid bars formed in a configuration similar to the frame shown in FIGS. 1 and 2 and flexible tubing extending along the solid bars to provide a fluid passageway external to the rigid bars.

Figure 3:
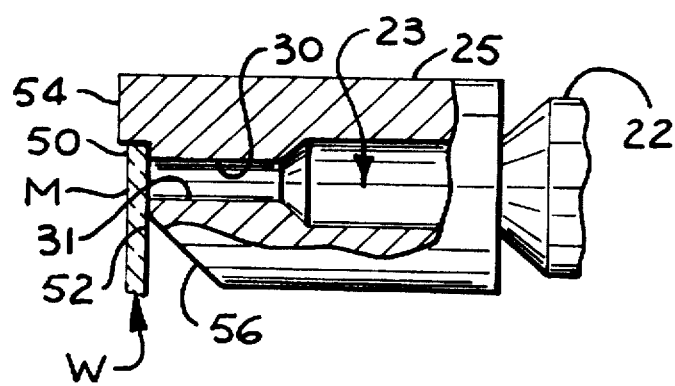
FIG. 3 is an enlarged fragmentary portion of the device of FIG. 1 showing the engagement of a finger tip portion of the device with the semiconductor wafer.

Each of the finger tip portions 25 has a notch 50 constructed for receiving a portion of the outer edge margin M of the wafer W therein for gripping the wafer, as shown for one of the fingers 22 in FIG. 3. The notch 50 defines a generally axially facing surface 52 and a projecting member 54 extending axially outwardly from the axially facing surface. The projecting members 54 of the lower two fingers 22 underlie and support the wafer to assist in holding the wafer along with the vacuum pressure. Generally, the distance r is measured from the center of the frame to a radially inward facing portion of the projecting member. A finger passageway opening 31 is located in the axially facing surface 52. The tip portion further comprises an axially rearwardly raked surface 56 sloping away from the axially facing surface 52. The finger tip portions are preferably made of a heat resistant plastic, such as plastic sold under the tradename VESPEL by E.I. DuPont de Nemours and Company.

In operation, the wafer handling device 10 is grasped in one hand by the handle 26 and the operator opens the valve 48 by pressing the button 49 to allow vacuum pressure to flow to the tip portions 25. The device 10 is then placed in contact with a wafer W with the projecting members 54 adjacent the outer peripheral edge of the wafer. The finger 22 extending from the upper corner of the manifold portion 28 is placed on the flat portion F of the wafer W. The vacuum pressure along with the projecting members 54 hold the wafer in a fixed position on the wafer handling device. The wafer W is then perpendicularly transported to the susceptor, properly aligned with the recess and placed securely in the recess. The operator then releases the button 49 of the valve 48 to shut off the flow of vacuum pressure to the finger tip portions 25 and release the wafer. The device 10 may also be used in transferring wafers to or from other processing equipment. A vacuum wand (not shown) may be used to transfer a wafer from a cassette to the wafer handling device.

It will be observed from the foregoing that the wafer handling device of this invention has numerous advantages. The illustrated configuration allows a semiconductor wafer to be picked up and held with vacuum pressure while only contacting the outer periphery edge margin of the wafer, thus reducing the possibility of damaging the front face of the wafer. The device allows the wafer to be placed on an epitaxial reactor susceptor from a perpendicular approach with respect to the device, thus providing better alignment on the susceptor than achieved by placing the wafer in the recess at an angle, and preventing damage to the wafer. Moreover, the device allows the wafers to be consistently positioned in the pocket in a selected orientation, further improving the quality of the finished wafer.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

What is claimed is:

1. A device for use in handling a semiconductor wafer from a front face of the wafer on which a finished surface is formed by processing of the semiconductor wafer, the front face including an outer peripheral edge margin, the device comprising fingers having tip portions adapted to engage the wafer for use in holding the wafer, a frame mounting the fingers and positively locating the fingers for simultaneously engaging the wafer on the outer peripheral edge margin of the front face of the wafer, while being free of engagement with a rear face of the wafer, vacuum pressure passaging means terminating at the tip portions of the fingers for applying a vacuum pressure through the finger tip portions to the wafer to grip the wafer, said passaging means comprising a finger passageway within each of the fingers terminating in an opening at the tip portion of each finger, the finger tip portion of each finger having a notch therein defining a generally axially facing surface and a projecting member extending axially outwardly from the axially facing surface, the finger passageway opening being in the axially facing surface.

2. A wafer handling device as set forth in claim 1 wherein said passaging means further comprises a frame passageway within the frame, the frame passageway being in fluid communication with the finger passageway of each finger.

3. A wafer handling device as set forth in claim 2 wherein the frame comprises a manifold portion defining the frame passageway therein, the fingers being mounted on the manifold portion, and a handle connected to the frame, the frame passageway extending from the manifold portion through the handle.

4. A wafer handling device as set forth in claim 3 further comprising a valve on the handle for selectively opening and closing said passaging means thereby to control the application of vacuum pressure through the finger tip portions.

5. A wafer handling device as set forth in claim 1 wherein the projecting members of the finger tip portions are constructed and arranged for receiving a thin, generally radially outwardly facing edge of the semiconductor wafer radially inwardly of the projecting members for engagement of the outer peripheral edge margin of the front face with the axially facing surfaces of the finger tip portions, the projecting members being constructed for engaging the outer peripheral edge margin to hold the wafer from the front face free of engagement with a rear face of the wafer opposite the front face.

6. A wafer handling device as set forth in claim 5 wherein the projecting members are constructed and arranged for receiving the wafer in a single predetermined orientation, the frame having a center generally coaxial with the center of the semiconductor wafer when held by the device, a first and second of the projecting members being disposed a distance r from the center of the frame and a third of the projecting members being disposed a distance less than r from the center.

7. A wafer handling device as set forth in claim 1 wherein the finger tip portions further comprise an axially rearwardly raked surface sloping away from the axially facing surface.

8. A wafer handling device for use in handling a semiconductor wafer from a front face of the wafer on which a finished surface is formed by processing of the semiconductor wafer, the front face including an outer peripheral edge margin, the wafer being generally circular in shape and having a flat formed therein along a portion of the outer peripheral edge margin, the device comprising fingers adapted to engage the wafer for use in holding the wafer, a frame mounting the fingers and positively locating the fingers for gripping the wafer to hold it in a predetermined orientation, the frame positioning the fingers for simultaneously engaging the wafer on the outer peripheral edge margin of the front face of the wafer while being free of engagement with a rear face of the wafer, the fingers each including a tip portion constructed for engaging the wafer along the outer peripheral edge margin of the front face, the device further comprising vacuum passaging means terminating at the tip portions of the fingers for applying a vacuum pressure through the finger tip portions to the wafer to grip the wafer.

9. A wafer handling device as set forth in claim 8 wherein the frame has a center generally coaxial with the center of the semiconductor wafer when held by the device, a first and second of the fingers being spaced a distance r from the center of the frame, a third of the fingers being spaced a distance less than r from the center of the frame.

10. A wafer handling device as set forth in claim 9 wherein the fingers are arranged to hold the semiconductor wafer with the flat at the top of the frame.

11. A wafer handling device as set forth in claim 10 wherein the third finger is arranged for engaging the flat of the wafer.

12. A wafer handling device as set forth in claim 10 wherein each tip portion has a notch therein defining a generally axially facing surface and projecting member extending axially facing from the axially facing surface.

13. A wafer handling device as set forth in claim 12 wherein the projecting members of the finger tip portions are constructed and arranged for receiving a thin, generally radially outwardly facing edge of the semiconductor wafer radially inwardly of the projecting members for engagement of the outer peripheral edge margin with the axially facing surfaces of the finger tip portions, the projecting members being constructed for engaging the outer peripheral edge margin to hold the wafer from the front face free of engagement with a rear face of the wafer opposite the front face.

14. A wafer handling device as set forth in claim 12 wherein the finger tip portions further comprise an axially rearwardly raked surface sloping away from the axially facing surface.

15. A device for use in handling a semiconductor wafer from a front face of the wafer on which a finished surface is formed by processing of the semiconductor wafer, the front face including an outer peripheral edge margin, the device comprising fingers having tip portions adapted to engage the wafer for use in holding the wafer, a frame mounting the fingers and positively locating the fingers for simultaneously engaging the wafer on the outer peripheral edge margin of the front face of the wafer, while being free of engagement with a rear face of the wafer, vacuum pressure passaging means terminating at the tip portions of the fingers for applying a vacuum pressure through the finger tip portions to the wafer to grip the wafer, said passaging means comprising a finger passageway within each of the fingers terminating in an opening at the tip portion of each finger, said passaging means further comprising a frame passageway within the frame, the frame passageway being in fluid communication with the finger passageway of each finger, the frame comprising a manifold portion defining the frame passageway therein, the fingers being mounted on the manifold portion, and a handle connected to the frame, the frame passageway extending from the manifold portion through the handle.

16. A wafer handling device as set forth in claim 15 further comprising a valve on the handle for selectively opening and closing said passaging means thereby to control the application of vacuum pressure through the finger tip portions.

17. A wafer handling device for use in handling a semiconductor wafer from a front face of the wafer on which a finished surface is formed by processing of the semiconductor wafer, the front face including an outer peripheral edge margin, the wafer being generally circular in shape and having a flat formed therein along a portion of the outer peripheral edge margin, the device comprising fingers adapted to engage the wafer for use in holding the wafer, a frame mounting the fingers and positively locating the fingers for gripping the wafer to hold it in a predetermined orientation, the frame having a center generally coaxial with the center of the semiconductor wafer when held by the device, a first and second of the fingers being spaced a distance r from the center of the frame, a third of the fingers being spaced a distance less than r from the center of the frame, wherein the fingers are arranged to hold the semiconductor wafer with the flat at the top of the frame, the fingers each including a tip portion having a notch therein defining a generally axially facing surface and a projecting member extending axially outwardly from the axially facing surface, the projecting members of the finger tip portions being constructed and arranged for receiving a thin, generally radially outwardly facing edge of the semiconductor wafer radially inwardly of the projecting members for engagement of the outer peripheral edge margin with the axially facing surfaces of the finger tip portions, the projecting members being constructed for engaging the outer peripheral edge margin to hold the wafer from the front face free of engagement with a rear face of the wafer opposite the front face.

18. A wafer handling device as set forth in claim 17 wherein the finger tip portions further comprise an axially rearwardly raked surface sloping away from the axially facing surface.

\* \* \* \* \*

UNITED STATES PATENT AND TRADEMARK OFFICE
CERTIFICATE OF CORRECTION

PATENT NO.   : 5,765,890
DATED        : June 16, 1998
INVENTOR(S)  : Eric Lee Gaylord et al.

It is certified that error appears in the above-identified patent and that said Letters Patent is hereby corrected as shown below:

Column 6, claim 12, line 45, "extending axially facing from" should read ---extending axially outwardly from---.

Signed and Sealed this

Eighteenth Day of May, 1999

Attest:

Q. TODD DICKINSON

Attesting Officer

Acting Commissioner of Patents and Trademarks